United States Patent
Ko et al.

(10) Patent No.: US 7,235,772 B2
(45) Date of Patent: Jun. 26, 2007

(54) IMAGE SENSOR WITH ANTI-SATURATION FUNCTION IN PIXEL LEVEL

(75) Inventors: Joo Yul Ko, Kyungki-do (KR); Won Tae Choi, Kyungki-do (KR); Deuk Hee Park, Seoul (KR); Shin Jae Kang, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 11/423,120

(22) Filed: Jun. 8, 2006

(65) Prior Publication Data
US 2006/0284051 A1    Dec. 21, 2006

(30) Foreign Application Priority Data
Jun. 21, 2005    (KR)    ............ 10-2005-0053539

(51) Int. Cl.
*H01L 27/00*    (2006.01)
(52) U.S. Cl. .................... 250/208.1; 348/308
(58) Field of Classification Search ............ 250/208.1, 250/214.1; 348/299, 301, 308, 314; 257/223, 257/292
See application file for complete search history.

(56) References Cited

U.S. PATENT DOCUMENTS
2006/0243887 A1*    11/2006    Boemler .............. 250/208.1

FOREIGN PATENT DOCUMENTS
KR    1020040093947    11/2004

\* cited by examiner

*Primary Examiner*—Kevin Pyo
(74) *Attorney, Agent, or Firm*—Lowe Hauptman & Berner

(57) ABSTRACT

In a CMOS image sensor of the invention, a dynamic range is varied at a per-pixel level by a light amount to prevent saturation without degrading color reproduction of an overall image. A photo diode generates charges in accordance with a received light amount. A drive transistor amplifies the charges generated in the photodiode at a given gain. Further, a saturation detector receives an output voltage from the drive transistor and judges the image sensor saturated if the output voltage is beyond a limited level. A switch switches on/off in response to the judgment of the saturation detector. Also, a plurality of floating diffusions store the charges of the photodiode transferred through the switch. The floating diffusions are selectively connected to both the photodiode and a gate of the drive transistor at on/off the switch.

8 Claims, 4 Drawing Sheets

(a)

(b)

IMAGE SENSOR WITH ANTI-SATURATION FUNCTION IN PIXEL LEVEL

CLAIM OF PRIORITY

This application claims the benefit of Korean Patent Application No. 2005-53539 filed on Jun. 21, 2005 in the Korean Intellectual Property Office, the disclosure of which is incorporated herein by reference.

BACKGROUND OF THE INVENTION

1. Field of the Invention

The present invention relates to an image sensor, more particularly a Complementary Metal Oxide Semiconductor (CMOS) image sensor with anti-saturation function in pixel level which can prevent saturation without degrading color reproduction of an overall image by varying a dynamic range at a per-pixel level.

2. Description of the Related Art

In general, each part of subjects present in the natural world differs in brightness and wavelengths of light. An image sensor is a device that converts different brightness and wavelengths of the subjects into an electrical value of a signal processable level, using photo-reactive properties of semiconductors.

Typically, the image sensor is used at a per-pixel level. A plurality of image sensors are aligned on a line of a certain standard to produce a pixel array. Then images of a certain standard are picked up via the pixel array.

The aforesaid image sensor includes a photo-reactive semiconductor device, and a plurality of transistors for outputting an electrical change of the semiconductor device as an electrical signal of a certain level.

FIG. 4 is a circuit diagram illustrating a 3 TR CMOS image sensor out of image sensors used at a per-pixel level according to the prior art.

Referring to FIG. 4, the image sensor includes a photo diode PD for changing a capacity value in response to light, a reset transistor Q2 for resetting, the photo diode PD to detect a next signal, a drive transistor Q4 for acting as a source follower via an electrical signal stored in the photo diode PD and a select transistor Q5 for selecting an output of a detected value.

That is, if the reset transistor Q2 stays on for a predetermined duration in response to a reset signal Rx, current is stored in the photo diode at an amount proportionate to the capacity value corresponding to light. In addition, the drive transistor Q4 amplifies a voltage of the photo diode PD into the electrical signal within a set range. A detected signal Vout outputted from the drive transistor Q4 is outputted in the addressing order of the pixel array if the select transistor Q5 is turned on.

FIG. 5 is a circuit diagram illustrating a 4 TR image sensor according to the prior art. As shown in FIG. 5, the 4 TR image sensor further includes a transfer transistor Q1 for transferring an electrical signal stored in a photo diode PD in response to a transfer signal Tx, and a floating diffusion FD for receiving charges accumulated in the photo diode via the transfer transistor Q1. At this time, the charges stored in the floating diffusion FD drive the drive transistor Q4.

In the 4 TR image sensor, with a reset signal Rx applied, the photo diode PD generates and accumulates charges in accordance with a received light amount. Then, the transfer transistor Q1 stays on for a predetermined duration and the charges of the photo diode PD are transferred to the floating diffusion FD. The drive transistor Q4 is operated by the charges stored in the floating diffusion FD to generate a detected signal Vout. The detected signal Vout is outputted in the addressing order of a pixel array via the select transistor Q5.

In the image senor as just described, a detected output voltage increases in proportion to the light amount. Due to a limited output range, light incident beyond the dynamic range saturates the image sensor, thus causing a whitening phenomenon in which images are not properly expressed but just whitened.

Typically, the dynamic range DR of the image sensor is defined as a ratio of a minimum measurable light amount $I_{ph\_min}$ and a maximum measurable light amount $I_{ph\_max}$ as expressed by Equation 1 below:

$$DR = 20\log\left(\frac{I_{ph\_max}}{I_{ph\_min}}\right) \qquad \text{Equation 1}$$

That is, a bigger dynamic range DR ensures concurrent expression of a bright portion and a dark portion within an image Therefore, the dynamic range DR of the image sensor needs to be increased.

But in the image sensor as described above, the dynamic range is fixed by properties of the photo diode PD and/or floating diffusion FD. Thus, light incident beyond the dynamic range renders normal reproduction of images impossible.

Therefore, various studies have been conducted to prevent saturation.

One method has been suggested to solve image reproduction problems caused by saturation. For this purpose, a detected voltage is outputted from a drive transistor logarithmically in response to a light amount received from a photo diode to increase the dynamic range. However, disadvantageously, this distorts colors, deteriorating overall color reproduction and image definition.

In another method to overcome a saturation-induced whitening phenomenon, if saturation occurs during a digital processing, a total output voltage of a pixel array is decreased. In this case, a detected voltage is adjusted even in other portions of an unsaturated image, thus disadvantageously degrading image definition.

SUMMARY OF THE INVENTION

The present invention has been made to solve the foregoing problems of the prior art and therefore an object according to certain embodiments of the present invention is to provide a Complementary Metal Oxide Semiconductor (CMOS) image sensor with anti-saturation function in pixel level which varies a dynamic range at a per-pixel level in accordance with a light amount to prevent saturation without degrading color reproduction of an overall image.

According to an aspect of the invention for realizing the object, there is provided an image sensor with anti-saturation function in pixel level, comprising: a photo diode for generating charges in accordance with a received light amount; a drive transistor for amplifying the charges generated in the photodiode at a given gain; a saturation detector for receiving an output voltage from the drive transistor and judging the image sensor saturated if the output voltage is beyond a limited level; a switch for switching on/off in response to the judgment of the saturation detector; and a plurality of floating diffusions for storing the charges of the photodiode transferred through the switch, the floating diffusions selectively connected to both the photodiode and a gate of the drive transistor at on/off of the switch.

According to another aspect of the invention for realizing the object, there is provided an image sensor with anti-saturation function of pixel level, comprising: a photo diode for generating charges in accordance with a received light amount; a transfer transistor for transferring the charges collected in the photodiode in response to a transfer signal; a first floating diffusion connected to the transfer transistor, for storing the charges generated in the photodiode and acting as a detection node; a second floating diffusion selectively connected to the transfer transistor, for storing the charges of the photo diode; a reset transistor for operating on/off in response to a reset signal to set an electric potential of at least one of the first and second floating diffusions as a reference electric potential and release the charges; an anti-saturation transistor for selectively connecting the second floating diffusion to the transfer transistor; a drive transistor for acting as a source follower based on a value stored in the at least one of the first and second floating diffusions; a select transistor disposed between the drive transistor and an output terminal, for outputting a voltage detected in the drive transistor in response to a select signal; an inverter connected to a drain terminal of the drive transistor, for inverting the detected voltage; and a feedback line for connecting an output terminal of the inverter to a gate terminal of the transistor.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Figure 1:
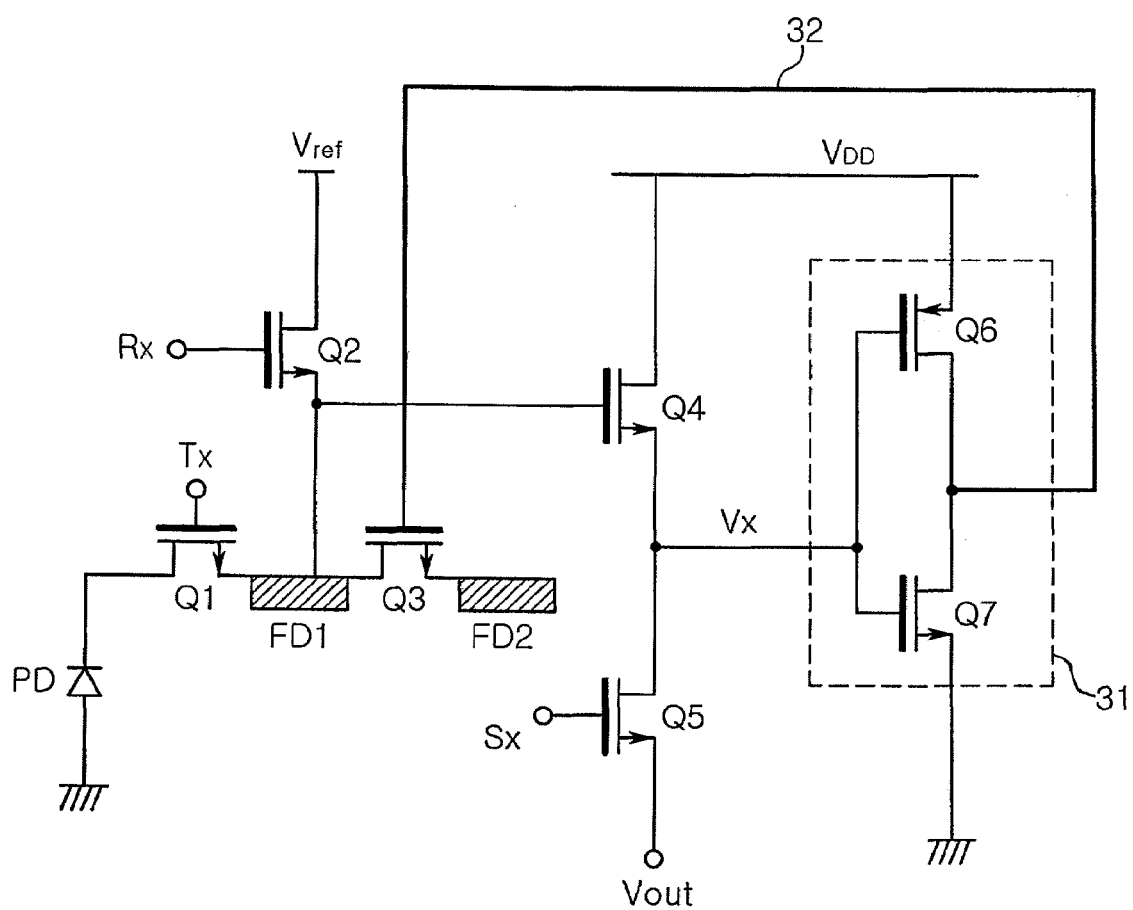
FIG. 1 is a circuit diagram illustrating an image sensor according to the invention.

Preferred embodiments of the present invention will now be described in detail with reference to the accompanying drawings, in which the same reference numerals are used throughout the different drawings to designate the same or similar components.

FIG. 1 is an exemplary detailed circuit diagram of an image sensor according to the invention.

Referring to FIG. 1, the image sensor of the invention includes a photo diode PD, a transfer transistor Q1, a first floating diffusion FD1, a second floating diffusion FD2, a reset transistor Q2, an anti-saturation transistor Q3, a drive transistor Q4, a select transistor Q5, an inverter 31 and a feedback line 32. The photo diode PD generates charges in accordance with a received light amount. The transfer transistor Q1 transfers the charges collected in the photodiode PD in response to a transfer signal Tx. The first floating diffusion FD1 is connected to the transfer transistor Q1 and stores the charges generated in the photo diode PD. Also, the second floating diffusion FD2 selectively receives the charges of the photo diode PD from the transfer transistor Q1 to store. The reset transistor Q2 sets an electric potential of at least one of the first and second floating diffusions FD1 and FD2 as a reference electric potential and releases the charges to reset the same in response to a reset signal Rx. Further, the anti-saturation transistor Q3 conducts on/off operations to connect/disconnect the floating diffusion FD2 to/from the transfer transistor Q1. The drive transistor Q4 acts as a source follower based on a value stored in the at least one of the first and second floating diffusions FD1 and FD2. In addition, the select transistor Q5 is disposed between the drive transistor Q4 and an output terminal Vou, and outputs a voltage detected in the drive transistor Q4 in response to a select signal. The inverter 31 is connected to a drain terminal of the drive transistor Q4. The feedback line 32 connects an output terminal of the inverter 31 to a gate terminal of the transistor Q3.

In this configuration, the first and second floating diffusions FD1 and FD2 serve as a detection node.

Referring to this embodiment of FIG. 1, the invention further includes a plurality of floating diffusions, a saturation detector and a switch in addition to constituents of the conventional image sensor. The saturation detector feeds back a sensed output voltage of the image sensor to detect whether or not the sensed output voltage is beyond a limited level set for saturation prevention. Also, the switch switches on/off in response to the judgment of the saturation detector to selectively connect floating diffusions to a circuit of the image sensor, thereby increasing capacitance of the detection node to expand the dynamic range and reducing the output voltage.

In the embodiment of the FIG. 1, the saturation detector is configured as the inverter 31 and the feedback line 32. But the inverter 13 may be substituted by a comparator for comparing whether the output voltage of the drive transistor Q4 is smaller than the pre-set reference voltage. In this case, the comparator receives the output voltage of the drive transistor Q4 and the pre-set reference voltage, and its output is connected to the anti-saturation transistor Q3 through the feedback line 32. Thereby the comparator turns on/off the anti-saturation transistor Q3 in response to the comparison result. The aforesaid inverter 31 and the comparator of the saturation detector can be substituted by other structure which can confirm whether or not the output voltage of the drive transistor Q4 is beyond a limited level, and accordingly turn on/off the anti-saturation transistor Q3.

In the embodiment of FIG. 1, the floating diffusions can be configured by connecting the first and second floating diffusions FD1 and FD2 to the transfer transistor Q1 in parallel. Alternatively, for example, in case of a 3 TR image sensor, the first and second floating diffusions FD1 and FD2 may be connected in parallel to the photo diode PD. At this time, the first floating diffusion FD1 is fixedly connected and the second floating diffusion FD2 is selectively connected.

Further, the switch is configured as an anti-saturation transistor Q3 for conducting on/off operations to selectively connect the second floating diffusion FD2 to the transfer transistor Q1. The saturation detector is comprised of the inverter 31 with an input terminal connected to a drain terminal of the drive transistor Q4 and the feedback line 32 for applying an output of the inverter 31 to a gate of the anti-saturation transistor Q3. If an output voltage Vx of the drive transistor Q4 is decreased to a certain level or less, the output of the inverter 31 turns into a high level and is supplied to the anti-saturation transistor Q3 through the feedback line 32, thereby turning on the anti-saturation transistor Q3. Then, the second floating diffusion FD2 gets connected to the transfer transistor Q1 together with the first floating diffusion FD1. This boosts an overall capacity value of the detection node so that the detected voltage is outputted within the limited level even if the light amount is increased.

The reset transistor Q2 and select transistor Q5 may not be configured depending on the type of the image sensor.

An explanation will be given about functions of an image sensor of the invention configured as above with reference to an equivalent circuit shown in FIGS. 2(a) and (b).

Figure 2:
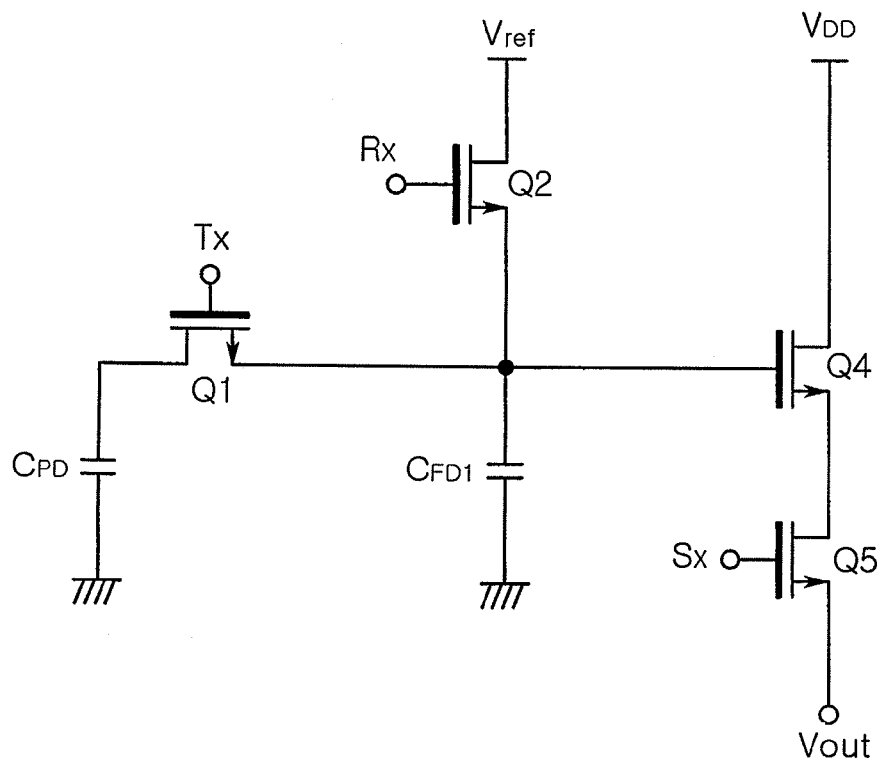
FIGS. 2(a) and(b) are equivalent circuit diagrams illustrating an image sensor based on operational status according to the invention.
Figure 2:
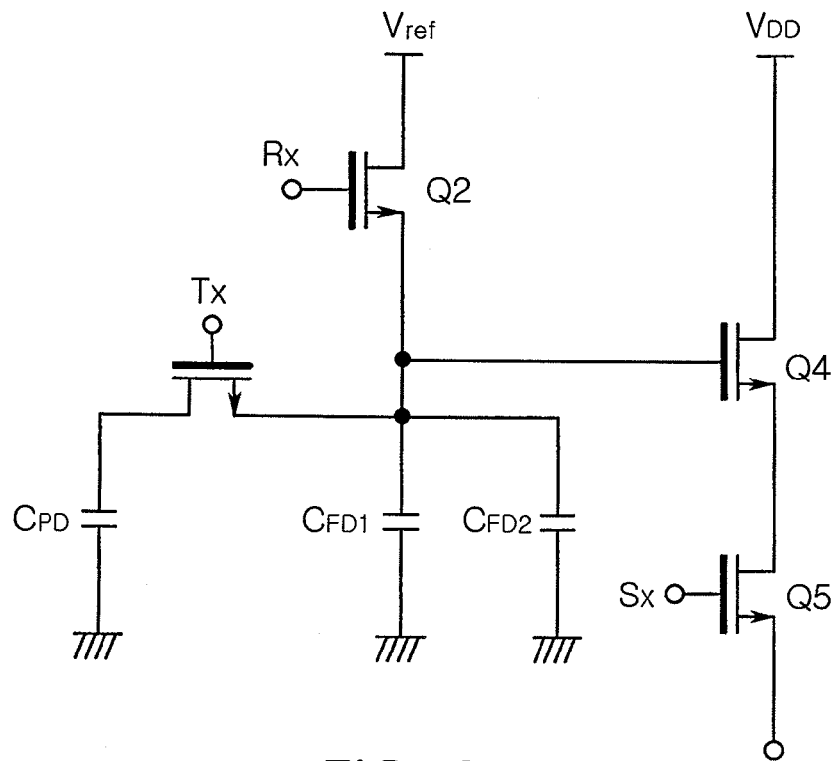

FIG. 2(a) is an equivalent circuit diagram illustrating the image sensor in case where light enters within a limited level. If a light amount falls within the set range, an output voltage (i.e., drain voltage) of a drive transistor Q4 reaches a reference level or more, and correspondingly, an output of an inverter 31 becomes a low level. Therefore, an anti-saturation transistor Q3 is turned off and only a first floating diffusion FD1 gets connected to a transfer transistor Q1, thus constituting the equivalent circuit as shown in FIG. 2(a).

Figure 3:
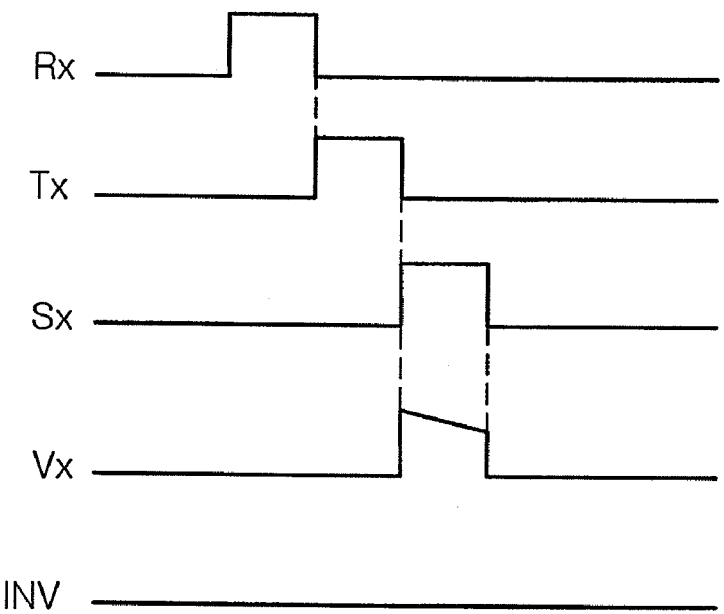
FIGS. 3(a) and 3(b) are operation timing diagrams illustrating an image sensor according to the invention.
Figure 3:
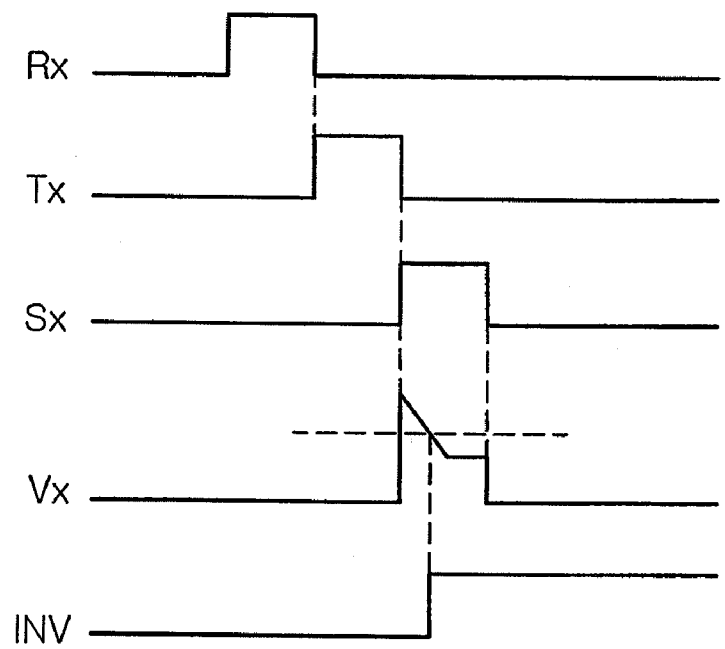
Figure 4:
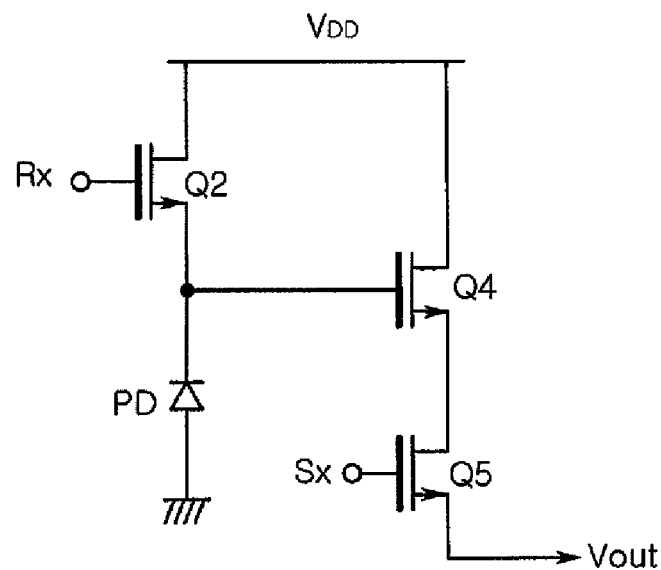
FIG. 4 is a circuit diagram illustrating an image sensor according to the prior art.
Figure 5:
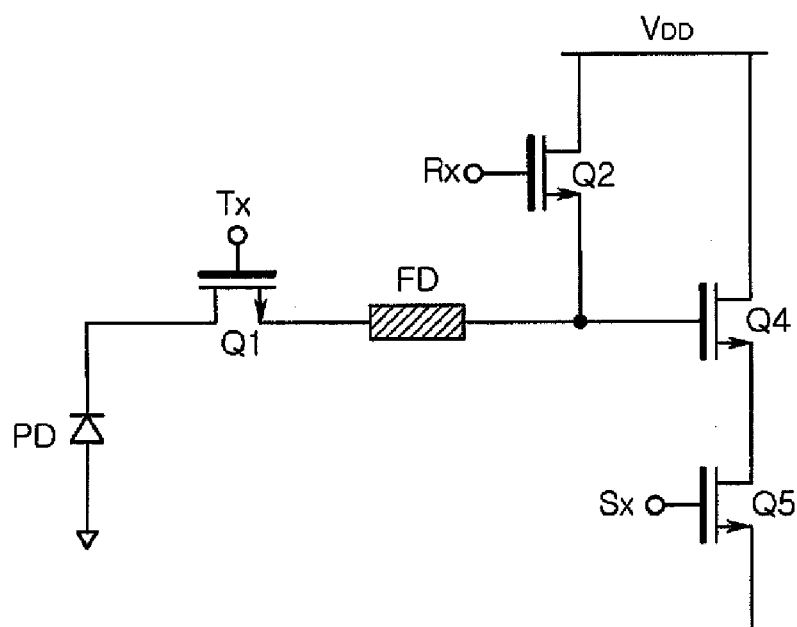
FIG. 5 is a circuit diagram illustrating another image sensor according to the prior art.

At this time, as shown in FIG. 3(a), with a reset signal Rx having a predetermined on-duty time applied, a reset transistor Q2 is turned on to reset the first floating diffusion FD1 node into a reference electric potential $Vref-V_{TH}$. Herein, Vref denotes a reference voltage applied to the reset transistor Q2 and $V_{TH}$ denotes a threshold voltage charged on the reset transistor Q2.

A transfer signal Tx is applied at a falling edge of the reset signal Rx, and in turn, the reset transistor Q2 is turned off and the transfer transistor Q1 is turned on at the same time. In this case, the photo diode PD is exposed to light, thereby generating charges at an amount proportionate to the exposed light amount and wavelength. The charges are stored in the first floating diffusion FD1 while the transfer transistor Q1 stays on. A value stored in the first floating diffusion FD1 is amplified at a given gain by the drive transistor Q4 which acts as a source follower. The stored value is outputted via the turned-on select transistor Q5 while a select signal Sx is applied as shown in FIG. 3(a).

In this case, an output voltage Vx of the drive transistor Q4 is expressed by Equation $Q_{photo}=C_{FD1} \times V_X$.

During repetition of the aforesaid operations, in case where the light amount is increased beyond a limited level, as shown in FIG. 3(b), the output voltage Vx of the drive transistor is lowered to a reference level or less. Correspondingly, an output of the inverter 31 becomes a high level and turns on the anti-saturation transistor Q3 so that the first floating diffusion FD2 gets connected to the transfer transistor Q1. In this case, the equivalent circuit is configured as shown in FIG. 2(b) so that the first floating diffusion FD1 and the second floating diffusion FD2 are connected in parallel. At this time, capacitance increases to $C_{FD1}+C_{FD2}$. Therefore, the output voltage Vx of the drive transistor Q4 is expressed by Equation $Q_{photo}=(C_{FD1}+C_{FD2}) \times V_X$. In comparison with FIG. 2(a), capacitance is doubled and the output voltage level is substantially halved.

The aforesaid operations are carried out for each image sensor at a per-pixel level. In case of a pixel array configured with such image sensors, the image sensor operates as shown in FIG. 2(a) or (b), in accordance with the amount of light incident at each pixel level. Thus, an output level is reduced at a predetermined rate in some portions of an overall image if they have too much incident light, thereby preventing a whitening phenomenon. Also, in other portions where light enters within a set range, the image sensor operates normally, thus ensuring color reproduction substantially true to life. This enhances overall image definition.

As set forth above, an image sensor of the invention further increases floating diffusion areas in case where incident light reaches a saturation limit for each image sensor at a per-pixel level. This reduces a voltage level, thus preventing a saturation-induced whitening phenomenon. As a result, saturation can be prevented at a per-pixel level, thus ensuring color reproduction in other portions where light enters within a set range and advantageously improving overall image definition.

While the present invention has been shown and described in connection with the preferred embodiments, it will be apparent to those skilled in the art that modifications and variations can be made without departing from the spirit and scope of the invention as defined by the appended claims.

What is claimed is:

1. An image sensor with anti-saturation function in pixel level, comprising:
a photo diode for generating charges in accordance with a received light amount;
a drive transistor for amplifying the charges generated in the photodiode at a given gain;
a saturation detector for receiving an output voltage from the drive transistor and judging the image sensor saturated if the output voltage is beyond a limited level;
a switch for switching on/off in response to the judgment of the saturation detector; and
a plurality of floating diffusions for storing the charges of the photodiode transferred through the switch, the floating diffusions selectively connected to both the photodiode and a gate of the drive transistor at on/off of the switch.

2. The image sensor according to claim 1, wherein the switch comprises an anti-saturation transistor for switching on/off in response to an output signal from the saturation detector and selectively connecting the floating diffusions to the photo diode and the drive transistor.

3. The image sensor according to claim 2, wherein the saturation detector comprises:
an inverter having an input terminal connected to a drain terminal of the drive transistor; and
a feedback line for supplying an output of the inverter to a gate of the anti-saturation transistor.

4. The image sensor according to claim 2, wherein the saturation detector comprises a comparator for comparing an output voltage of the drive transistor with a pre-set reference voltage and turning on the anti-saturation transistor if the output voltage of the drive transistor is smaller than the reference voltage.

5. The image sensor according to claim 1, further comprising a floating diffusion for storing the charges generated by the photodiode, the first floating diffusion constantly connected to the photodiode.

6. The image sensor according to claim 1, further comprising a reset transistor for setting an electric potential of the floating diffusions and releasing the photocharges.

7. The image sensor according to claim 1, further comprising a transfer gate for transferring the charges of the photodiode to the floating diffusions in response to a transfer signal.

8. An image sensor with anti-saturation function in pixel level, comprising:
a photo diode for generating charges in accordance with a received light amount;

a transfer transistor for transferring the charges collected in the photodiode in response to a transfer signal;

a first floating diffusion connected to the transfer transistor, for storing the charges generated in the photodiode and acting as a detection node;

a second floating diffusion selectively connected to the transfer transistor, for storing the charges of the photo diode;

a reset transistor for operating on/off in response to a reset signal to set an electric potential of at least one of the first and second floating diffusions as a reference electric potential and release the charges;

an anti-saturation transistor for selectively connecting the second floating diffusion to the transfer transistor;

a drive transistor for acting as a source follower based on a value stored in the at least one of the first and second floating diffusions;

a select transistor disposed between the drive transistor and an output terminal, for outputting a voltage detected in the drive transistor in response to a select signal;

an inverter connected to a drain terminal of the drive transistor, for inverting the detected voltage; and a feedback line for connecting an output terminal of the inverter to a gate terminal of the transistor.

\* \* \* \* \*